United States Patent
Liu

(10) Patent No.: US 7,071,076 B2
(45) Date of Patent: Jul. 4, 2006

(54) METHOD OF MANUFACTURING SEMICONDUCTOR DEVICE

(75) Inventor: Guo Lin Liu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 25 days.

(21) Appl. No.: 10/875,212

(22) Filed: Jun. 25, 2004

(65) Prior Publication Data

US 2004/0262707 A1 Dec. 30, 2004

(30) Foreign Application Priority Data

Jun. 26, 2003 (JP) ............................. 2003-182822

(51) Int. Cl.
*H01L 21/76* (2006.01)

(52) U.S. Cl. ..................... 438/439; 438/424; 438/425; 438/443; 438/700

(58) Field of Classification Search ................. 438/439
See application file for complete search history.

(56) References Cited

U.S. PATENT DOCUMENTS

| 5,459,096 | A | * | 10/1995 | Venkatesan et al. ......... 438/437 |
| 5,989,978 | A | * | 11/1999 | Peidous ..................... 438/436 |
| 6,133,113 | A | * | 10/2000 | Jenq et al. .................. 438/424 |
| 6,143,624 | A | * | 11/2000 | Kepler et al. ............... 438/433 |
| 6,281,063 | B1 | * | 8/2001 | Jen et al. .................... 438/221 |
| 6,566,207 | B1 | * | 5/2003 | Park .......................... 438/296 |
| 6,828,209 | B1 | * | 12/2004 | Maruo ........................ 438/424 |

FOREIGN PATENT DOCUMENTS

JP    2000-306989    11/2000

\* cited by examiner

*Primary Examiner*—Kenneth Parker
*Assistant Examiner*—José R. Diaz
(74) *Attorney, Agent, or Firm*—Takeuchi &Kubotera, LLP

(57) ABSTRACT

A semiconductor device has an STI oxide film (106), of which surface is positioned higher than the surface of the silicon substrate (100) to prevent a pointed portion and a thin film thickness of a gate oxide film (108). The gate oxide film (106) becomes thicker toward a side wall (112) of the STI oxide film (106) to prevent the leakage current and increase the gate breakdown voltage.

10 Claims, 4 Drawing Sheets

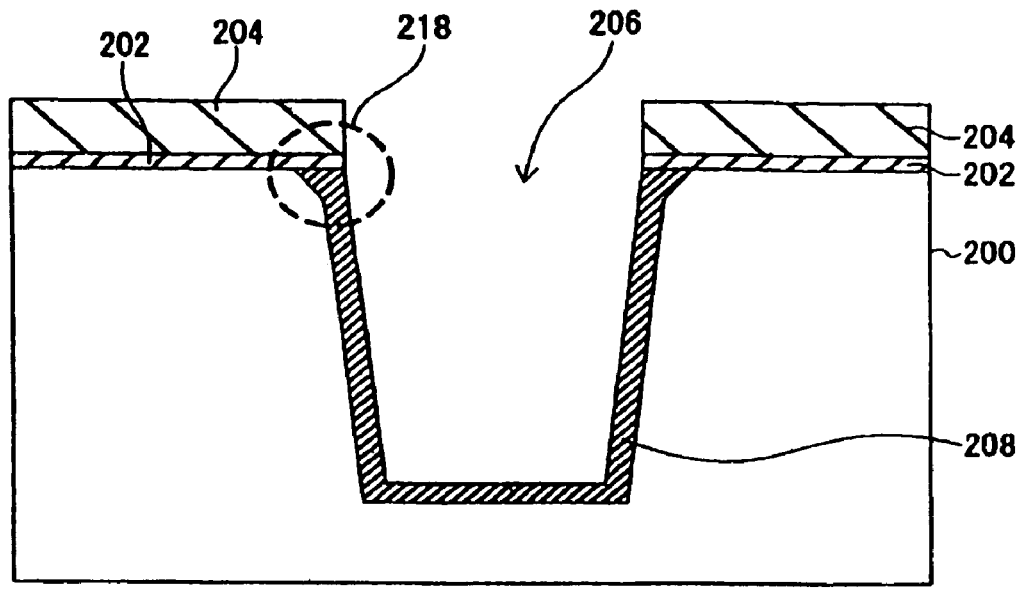
FIG. 4 (A) PRIOR ART
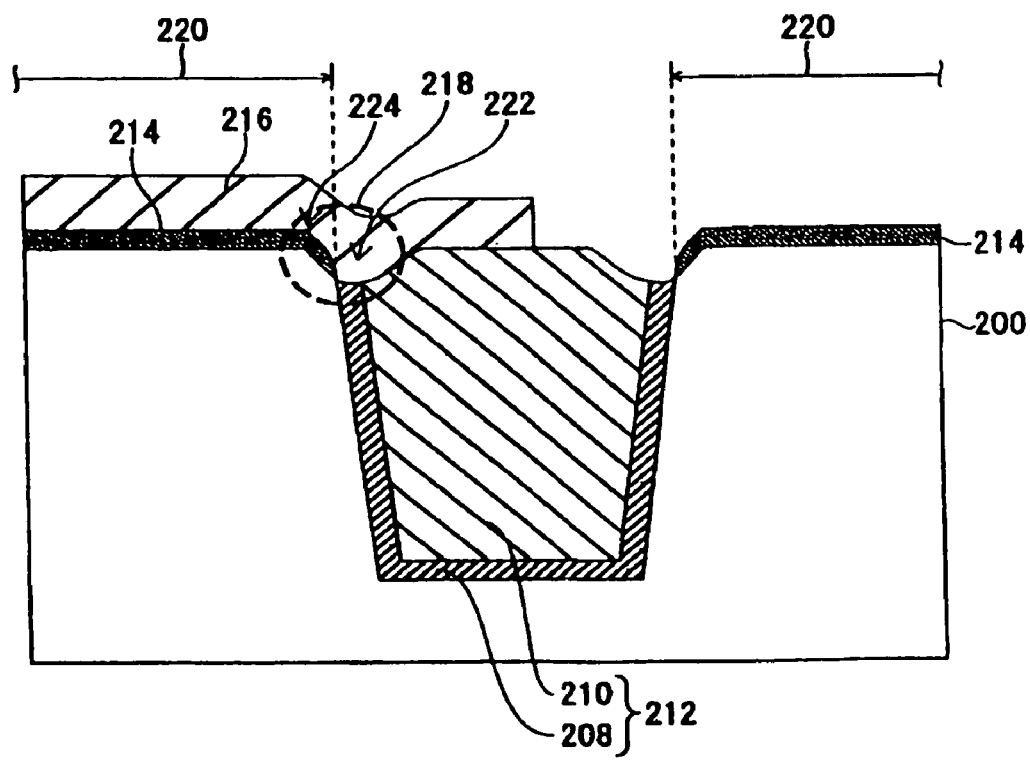
FIG. 4 (B) PRIOR ART

METHOD OF MANUFACTURING SEMICONDUCTOR DEVICE

BACKGROUND OF THE INVENTION

1. Field of the Invention

The present invention relates to a semiconductor device, especially a semiconductor device having a gate oxide film, which is provided adjacent to a region isolating element and has a suitable structure, and a method of manufacturing the semiconductor device.

2. Description of the Related Art

An element-isolating region, which electrically isolates elements in a semiconductor device, has been formed. The local Oxidation of Silicon (LOCOS) method has been frequently used to provided the element-isolating region. In the LOCOS method, however, a bird-beak is produced in the element-isolating region by the thermal oxidation in the LOCOS method. Accordingly, it was difficult to make small the element-isolating region, causing a barrier in the high integration of the semiconductor device.

In recent years, the Shallow Trench Isolation (STI) method has been proposed, which employs a trench structure to provide the element-isolating region.

The element-isolating region is provided, for example, as described below by the STI method.

A pad oxide film and a mask nitride film are formed on the surface of a silicon substrate (hereinafter "Si substrate") in this order. An area corresponding to the element-isolating region is exposed by patterning using a photolithography etching. A trench is formed by the Reactive Ion Etching (RIE) method using a patterned nitride film as an etching mask. Afterward, an oxide film is formed in the bottom and side walls of the trench (generally called "side-wall oxide film") by the thermal oxidation method to reduce the influences caused by a damage, such as a defective produced in side the trench by the RIE method. A silicon oxide film (CVD film) is buried in the Si substrate with the trench by Chemical Vapor Deposition (CVD) method. The surface of the Si substrate is made flat by the Chemical Mechanical Polish (CMP) method. Then, the mask nitride film and the pad oxide film are removed to provide the element-isolating region. The element-isolating region (hereinafter sometimes "STI oxide film") is composed of the side-wall oxide film and the CVD oxide film.

Afterward, when a gate oxide film is formed in an active region, an oxide film is formed by the thermal oxidation and removed so as to remove the damage caused by the etching and improve the quality of the gate oxide. The gate oxide film is formed in the active region, for example, by the thermal oxidation and then, a gate electrode is formed.

In such a conventional STI method, a hollow is produced around the side wall of the STI oxide film by the etching. If the gate oxide film is formed with the presence of the hollow, the thickness of the gate oxide film becomes small partly or the shape of the gate oxide film becomes pointed (sometimes called "pointed portion"). If the gate electrode is formed in the active and element-isolating regions with such a shape of the gate oxide film, malfunction, such as reduction of gate breakdown voltage and generation of leakage current, may easily occur.

Japanese Patent Application Kokai Number 2000-306989 proposes that a protective film is formed along the side wall of the element-isolating region and the pad oxide film is subject to etching to prevent the formation of the hollow produced in the element-isolating region. When the protective film is formed in the side wall of the element-isolating region with the hollow, the gate oxide film is made flat and the channel length of a transistor is not made small.

When making flat the Si substrate by CMP in the conventional method of forming the STI oxide film, since the mask nitride film acts as a stopper, the surface of the STI oxide film is formed at a position higher than the surface of the Si substrate. It is ideal that the surface of a wafer is uniformly made flat by this CPM process. Actually, however, the polishing speed is different according to difference in the density of the element pattern and the position of the element pattern in the surface of the wafer. Consequently, it is possible that the height of the surface of the STI oxide film is partly equal to or lower than the surface of the Si substrate.

When the height of the surface of the STI oxide film is equal to or lower than that of the surface of the Si substrate, the wafer easily receives the influences of the hollow caused by etching.

FIG. 4(A) shows the side-wall oxide film formed by the conventional forming method of the STI oxide film. A pad oxide film 202 and a mask nitride film 204 are formed on a Si substrate 200 in this order and then, a trench 206 is formed. The bottom and side wall of the trench 206 are oxidized by the thermal oxidation method to provide a side-wall oxide film 208. At this point, an edge region 218 is formed, which is a boarder region between the side-wall oxide film 208 and the Si substrate 200 and surrounded by a circle of a dotted line. The edge region is prone to be oxidized by the influence of the pad oxide film 202 during the thermal oxidation process of the trench 206.

FIG. 4(B) shows the element-isolating region and its vicinity after a gate electrode 216 is formed. A gate oxide film 214 is formed on an active region 220 in the Si substrate 200. The element-isolating region or the STI oxide film 212 is composed of the side-wall oxide film 208 and a CVD oxide film 210. The gate electrode 216 is formed in the active region 220 and part of the STI oxide film 212.

The surface of the STI oxide film 212 is polished by CMP and the height thereof is made substantially equal to the surface of the Si substrate 200.

When the height of the surface of the STI oxide film is equal to or lower than that of the surface of Si substrate, the wafer is prone to have the influences of the hollow caused by etching. Also, as shown in FIG. 4(A), since the side-wall oxidation of the edge region 218 is deep, when the gate oxide film is formed after etching the edge region, a pointed portion 224 is frequently produced at the gate oxide film 214. In addition, the thickness of the gate oxide film 214 in the edge region frequently becomes small.

The gate oxide film 214 adjoins to a diffusion region (drain and source regions) in a direction of the channel length (direction perpendicular to the sheet of the drawings). As shown in FIG. 4(B), when the gate electrode is formed in the active region and part of the element-isolating region, that is, when the gate electrode 216 is formed in a direction perpendicular to the channel length direction, the gate oxide film 214 adjoins to the STI oxide film 212. Since electrical charges are easily collected to the edge region 218 of the gate oxide film 214, if the pointed portion 224 is present or the gate oxide film 214 has a thin film at the edge region 218, malfunction, such as reduction of the gate breakdown voltage and generation of the leak current, may occur.

Accordingly, there has been required a semiconductor device and a method of manufacturing the same, which has (1) an element-isolating region or an STI oxide film of which surface is formed at a position higher than the surface of a Si substrate in whole area of a wafer and (2) a gate oxide film having an increased breakdown voltage.

Applicant of this invention came to the conclusion that it is possible to form such an STI oxide film and gate oxide film by etching the Si substrate after forming the STI oxide film by CMP.

SUMMARY OF THE INVENTION

A semiconductor device according to the present invention comprises a silicon substrate, at least one element-isolating region provided in the silicon substrate, a plurality of active regions isolated from each other by the element-isolating region, and a gate oxide film provided on the active region. The upper surface of the element-isolating region is positioned higher than the upper surface of the silicon substrate. Also the gate oxide film is raised toward a side wall of the element-isolating region and has a film thickness which becomes larger toward the side wall of the element-isolating region. Here, "raised" means that the upper surface of the gate oxide film is warped upwardly toward the top end of the side wall of the element-isolating region with a smooth or gentle curve.

Since the surface of the element-isolating region on the wafer is positioned higher than the surface of the silicon substrate, a pointed portion and a thin film thickness in the edge section are difficult to occur. Also, since the gate oxide film becomes thicker in the vicinity of the side wall of the element-isolating region, the leakage current is difficult to occur and the gate breakdown voltage increases. Accordingly, the device characteristics are assured and the manufacturing yield is increased.

A method of manufacturing the above described semiconductor device comprises, for forming the gate oxide film after forming the element-isolating region in the silicon substrate, the steps of (a) scraping the upper surface of the silicon substrate by an anisotropic-etching such that the upper surface of the element-isolating region is positioned higher the upper surface of the silicon substrate, (b) forming a sacrifice oxide film on the upper surface of the silicon substrate by oxidizing the upper surface of the silicon substrate which has been scraped by the anisotropic-etching, (c) removing the sacrifice oxide film, and (d) forming the gate oxide film on the upper surface of the silicon substrate, on which the sacrifice oxide film has been removed.

According to the above method, since the silicon substrate is etched after forming the element-isolating region, the surface of the element-isolating region on the wafer can be certainly positioned higher than the surface of the silicon substrate. Accordingly, the malfunction about the height of the wafer, which is caused by CMP, is prevented, and the occurrence of the pointed portion and thin film thickness in the edge section is also prevented. Also, since the gate oxide film is made thicker at the vicinity of the side wall of the element-isolating region, the leakage current is difficult to occur and the gate breakdown voltage increases. Accordingly, the device characteristics are assured and the manufacturing yield is increased.

The above method further comprises the step of implanting oxygen ion into said upper surface of said silicon substrate after said step of (a) but before said step (b).

BRIEF DESCRIPTION OF THE DRAWINGS

FIGS. 4(A)–4(B) are sectional views of a conventional semiconductor device.

DESCRIPTION OF THE PREFERRED EMBODIMENTS

Figure 1A:
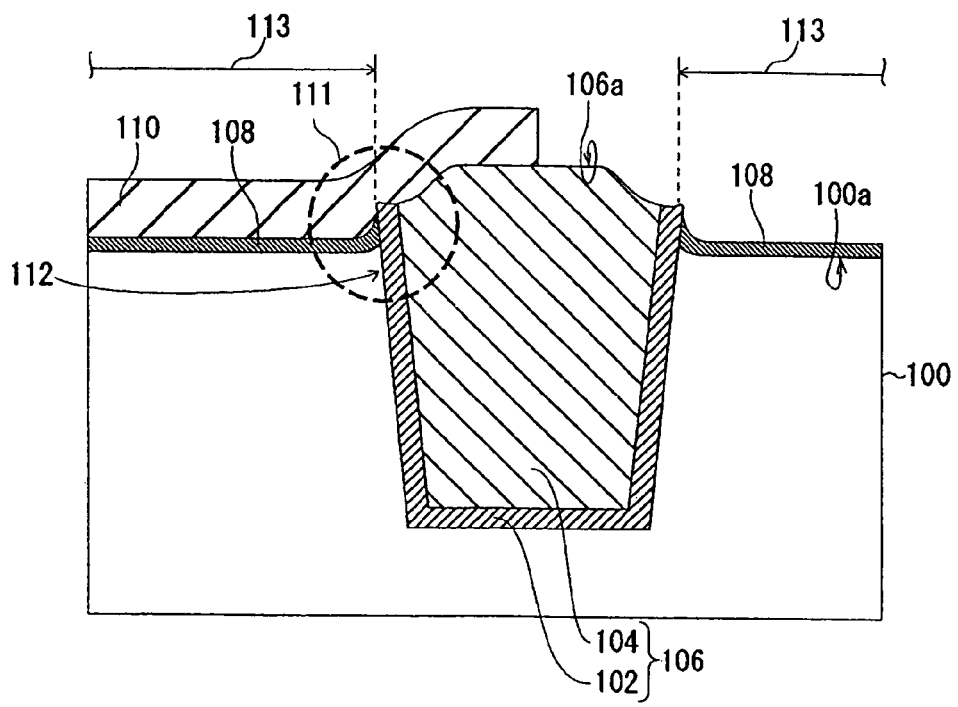
FIG. 1(A) is a partly sectional view of a semiconductor device according to the first embodiment of the present invention.

The embodiments of the present invention will now be described below with reference of FIGS. 1(A)–1(B) to 3(A)–3(D). Each of the drawings simplifies the shape, size, and positional relationship of the respective elements to such an extent that the invention is understood, and the invention is not limited to samples illustrated in the drawings. Also, hatching indicating a sectional view is omitted except for a part thereof to make the drawings intelligible. In addition, although specified material and condition are sometimes used in the description below, such material and condition are merely preferred samples and the invention is not limited to them. Elements having similar function in the drawings have the same reference numerals and overlapped description will be omitted.

(First Embodiment)

In FIG. 1(A), a groove-like trench is formed in a Si substrate 100 and an element-isolating region is formed by an STI oxidation film 106. The STI oxide film 106 is composed of a side-wall oxide film 102 adjacent to the Si substrate 100 and a CVD oxide film 104 formed inside the side-wall oxidation film 102. The top side of the STI oxide film 106 projects from the surface of the Si substrate 100. Accordingly, the top surface 106a of the STI oxide film 106 is higher than the surface 100a of the Si substrate 100.

The area of the Si substrate 100 isolated by the element-isolating region is used as an active region 113. In FIG. 1(A), a gate oxide film 108 is formed in the active region 113 adjacent to the element-isolating region. The gate oxide film 108 has a film thickness which becomes thicker toward a side wall 112 of the STI oxide film 106 in the vicinity of the side wall 112 and is raised toward the upper end of the side wall 112. A gate electrode 110 is formed in the surfaces of the gate oxide film 108 and part of the STI oxide film 106.

Figure 1B:
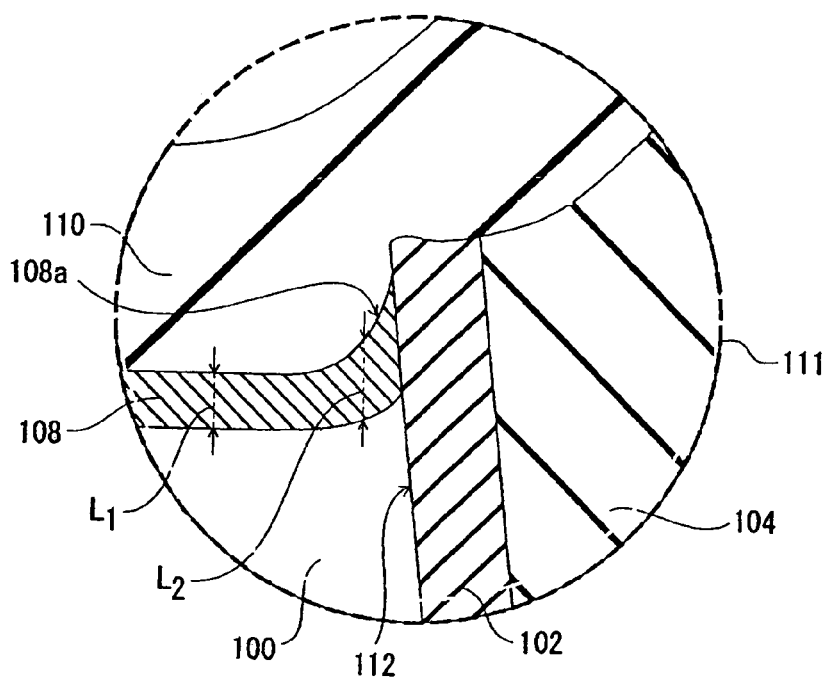
FIG. 1(B) is an enlarged sectional view of part of the semiconductor device of FIG. 1(A).

FIG. 1(B) is an enlarged view of an edge region 111 surrounded by a dotted line in FIG. 1(A) and illustrates a section with respect to a plane perpendicular to the surface of the Si substrate 100. A thickness $L_1$ of the gate oxide film 108 at the position far from the side wall 112 is smaller than a thickness $L_2$ of the gate oxide film 108 at the position close to the side wall 112. A surface 108a of the gate oxide film 108 is raised toward the upper end of the side wall 112 with gentle curve.

As shown in FIG. 1(B), since the gate oxide film 108 has a film thickness which becomes thicker toward the side wall 112n and is raised toward the upper end of the side wall 112, the malfunction which is produced in the conventional device, such as the pointed portion and small film thickness, is not produced in the present invention. Also, since the thickness of the edge region, where electrical charge is collected, is large, the gate breakdown voltage increases and the leak current is difficult to be generated.

Figure 2A:
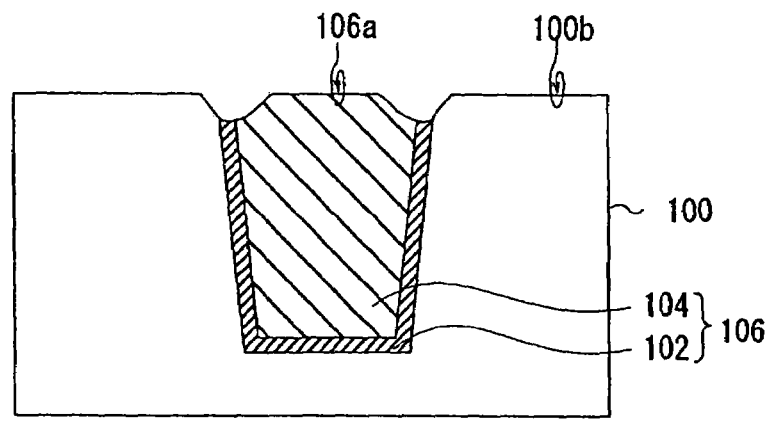
FIGS. 2(A)–2(D) illustrate manufacturing process of the first embodiment of the present invention, of the semiconductor device.

FIG. 2(A) illustrates a section of part of the semiconductor device under the condition that the mask nitride film and the pad oxide film are removed after the element-isolating region or the STI oxide film is formed. In an example in FIG. 2(A), the surface 106a of the STI oxide film 106 is polished by CMP to a height substantially equal to the surface 100b of the Si substrate 100.

Although the manufacturing method to form the semiconductor device in FIG. 2(A) is known, an example thereof is simply described below.

A pad oxide film is formed on the Si substrate 100 by thermal oxidation method with a film thickness of, for example, 10 nm–100 nm. A mask nitride film is formed by CVD method with a film-thickness-of, for example, 150 nm–350 nm. The area, in which the element-isolating region is formed, is opened by known photolithography etching technology. A trench is formed by the RIE method with a depth of, for example, 400 nm. The side-wall oxide film 102 is formed with a thickness of 10 nm–30 nm by oxidizing the bottom and side surfaces of the trench by the thermal oxidation. A CVD oxide film is formed by CVD method with a film thickness larger than the depth of the trench, thickness of the pad oxide film, and thickness of the mask nitride film. The CVD oxide film is made flat by VCMP, and the mask nitride film and the pad oxide film are removed by wet-etching in this order. Thus, pre-treatment for the Si substrate 100 according to the first embodiment is done. The semiconductor device shown in FIG. 2(A) is formed with the above pre-treatment to provide the Si substrate 100 having the STI oxide film of which height is substantially equal to the surface of the Si substrate 100.

The above pre-treatment to form the element-isolating region in the Si substrate and remove the pad oxide film is an example and a generally known manufacturing method of the element-isolating region may be used.

Figure 2B:
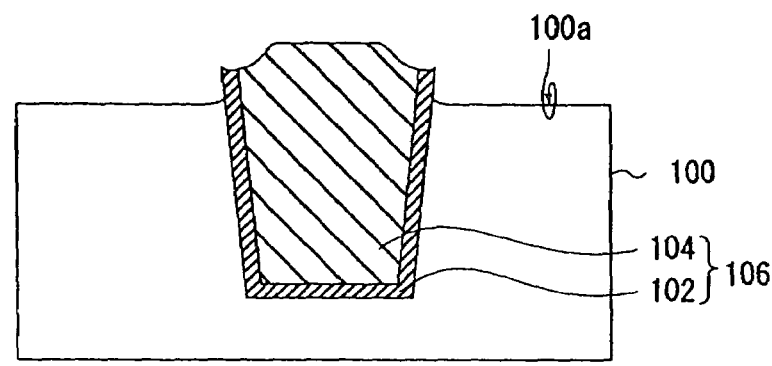

The surface 100b of thus obtained Si substrate 100 is subject to anisotropic-etching using, for example, HBr gas, to etch the Si substrate in the thickness direction thereof by 5–20 nm (FIG. 2(B)). The depth of the etching may be one to a few times thickness of the gate oxide film, which is formed afterward. At this point, a surface 106a of the STI oxide film 106 is higher than the surface of the Si substrate. Also, a surface 100a of the Si substrate 100 is raised gently toward the side wall 112 of the STI oxide film 106. By employing the anisotropic-etching, the shape of the surface of the Si substrate, which produces the pointed portion in the gate oxide film in the conventional semiconductor device, is scraped off.

Figure 2C:
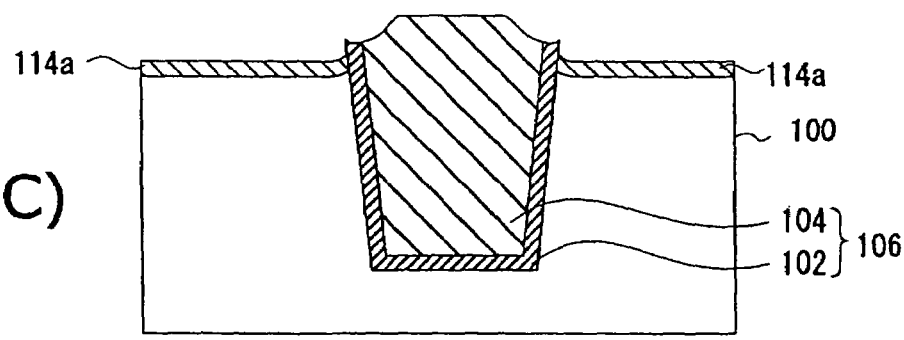

A sacrifice oxide film 114a is formed on the surface 100a of the Si substrate 100 by, for example, thermal oxidation method and the sacrifice oxide film 114a is removed (FIG. 2(C)) . By doing it, the damage caused by the etching is removed so that the film quality of a gate oxide film produced afterward is improved.

Figure 2D:
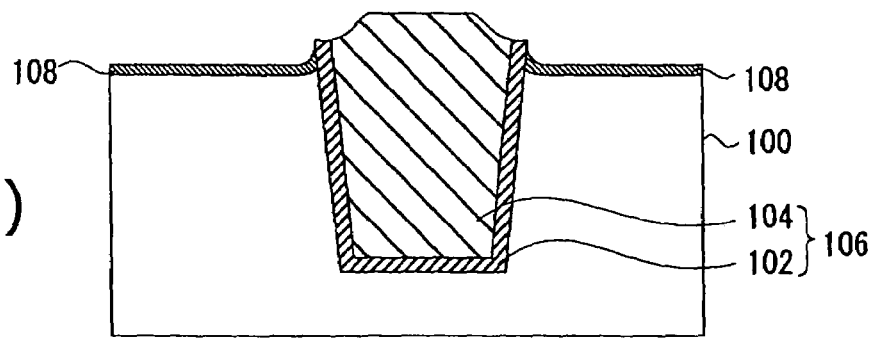

Then, a gate oxide film 108 is formed on the surface 100a of the Si substrate 100 by, for example, the thermal oxidation with a film thickness of 2–10 nm (FIG. 2(D)). When the gate oxide film 108 is formed by the thermal oxidation, since a region adjacent to the STI oxidation film 106 has a high density of oxygen, the region is prone to be easily oxidized. Accordingly, the film thickness of the gate oxide film 106 is made larger in the vicinity of the STI oxide film 106 (or in the edge region 111) than that in the area far away from the STI oxide film 106. The gate electrode is formed on the thus produced gate oxide film by a known technology (not shown).

According to the above method of manufacturing the semiconductor device, as shown in FIG. 1(A), the height of the STI oxidation film 106 is higher than the height of the surface of the Si substrate 100, and the gate oxidation film 108 is raised, in the edge region 111 adjacent to the STI oxidation film 106, toward the side wall 112 of the STI oxidation film 106 and has a film thickness which becomes larger, in the edge region 111, toward the side wall 112 of the STI oxidation film 106.

Since the SI substrate 100 is etched to reduce its height after CMP for flattening the surface, the height of the surface of the STI oxide film 106 is firmly higher than the height of the surface of the Si substrate 100. Accordingly, the gate oxide film 108, which is formed afterward, has no malfunction, such as the pointed portion and a thin film thickness.

Also, since the gate oxide film 108 is raised and has a film thickness which becomes larger, toward the sided wall 112 of the STI oxide film 106, the leakage current is difficult to occur and the gate breakdown voltage increases. Consequently, the device characteristics are assured and the production yield is increased.

Even before the above process, the STI oxidation film 106 is already higher than part of the surface of the Si substrate 100 after removing the pad oxide film. The above process is carried out for the part too to ensure more firmly that the surface of the STI oxide film 106 is higher than the surface of the Si substrate 100. Also, the gate oxide film can be raised toward the side wall 112 of the STI oxide film 106 and have a film thickness becoming larger toward the side wall 112 for the part too.

By the above treatment, the surface of the element-isolating region on the wafer is certainly higher than the surface of the Si substrate. That is, the malfunction about the height of the wafer caused by CMP is prevented and the pointed portion and thin film thickness of the gate oxide film in the edge region are also prevented.

(Second Embodiment)

In the method of manufacturing the semiconductor device according to the second embodiment of the present invention, oxygen ion is implanted after the Si substrate is subject to the anisotropic-etching. By doing the ion implantation, the film thickness of the sacrifice oxide film is made small in the vicinity of the element-isolating region and large in the area far from the element-isolating region so that a better shape of the gate oxide film is provided.

Figure 3A:
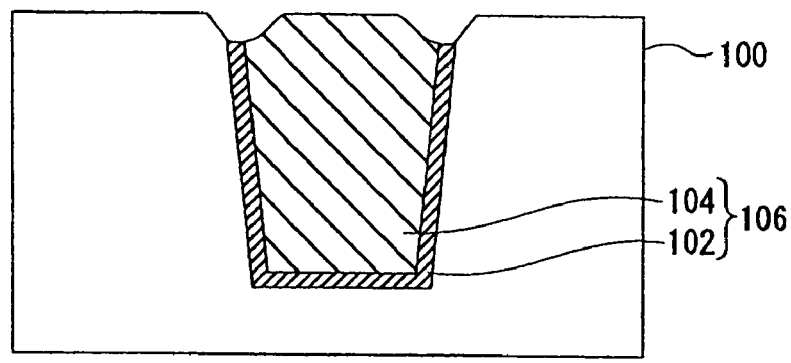
FIGS. 3(A)–3(D) illustrate manufacturing process of the second embodiment of the present invention, of the semiconductor device.

In FIG. 3(A), which is a sectional view of the semiconductor device after removing the pad oxide film, the surface of the STI oxide film is polished by CMP to a level substantially equal to that of the surface of the Si substrate.

The surface 100b of the Si substrate 100 is etched by 10–25 nm by means of anisotropic-etching using, for example, HBr gas (FIG. 2(B)). The depth of the etching in the second embodiment is slightly large than that of the first embodiment. This is performed to obtain the shade effect of the STI oxide film firmly during the oxygen ion implantation carried out afterward. Here, in the same way as the first embodiment, a surface 106a of the STI oxide film 106 is higher than a surface 100c of the Si substrate 100.

Figure 3B:
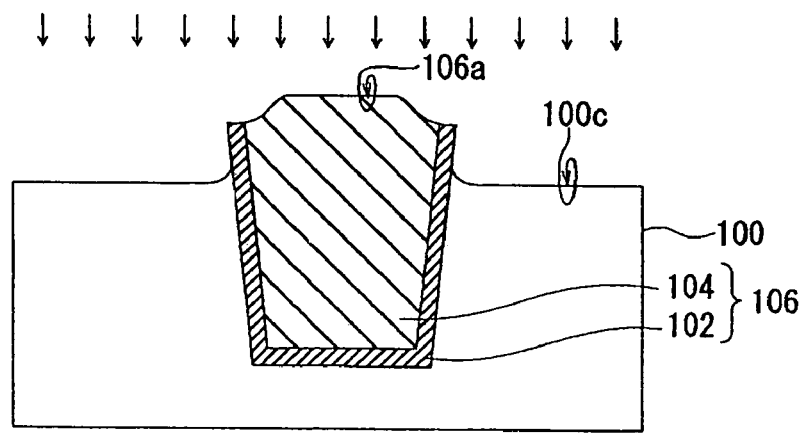

Then, oxygen ion is implanted into the surface 100c of the Si substrate 100 with, for example, an implantation energy of 3–6 keV and a dose amount of $1 \times 10^{12}$ to $5 \times 10^{16}$ cm$^{-2}$ (FIG. 3(B)). At this point, the implantation amount of oxygen ion is small in the vicinity of the STI oxide film 106 and large in an area far from the STI oxide film 106 by the shield or shade effect of the STI oxide film 106.

Figure 3C:
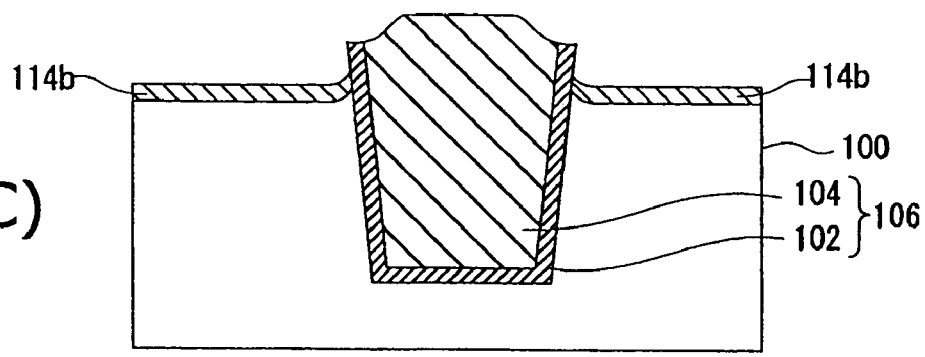

A sacrifice oxide film 114b is formed in the surface 100c of the Si substrate 100 by, for example, the thermal oxidation method (FIG. 3(C)). The sacrifice oxide film 114b is formed thin in the vicinity of the STI oxide film 106, where the density of the implanted oxygen ion is small, and thick in the area far from the STI oxide film 106, where the density of the implanted oxygen ion is large. Then, the sacrifice oxide film 114b is removed (not shown). Since the sacrifice oxide film 114b is formed thin in the surface of the Si substrate 100 in the vicinity of the STI oxide film 106, the surface of the Si substrate 100 is raised toward the side wall 112 of the STI oxide film 106 still more gently than that of the first embodiment.

Figure 3D:
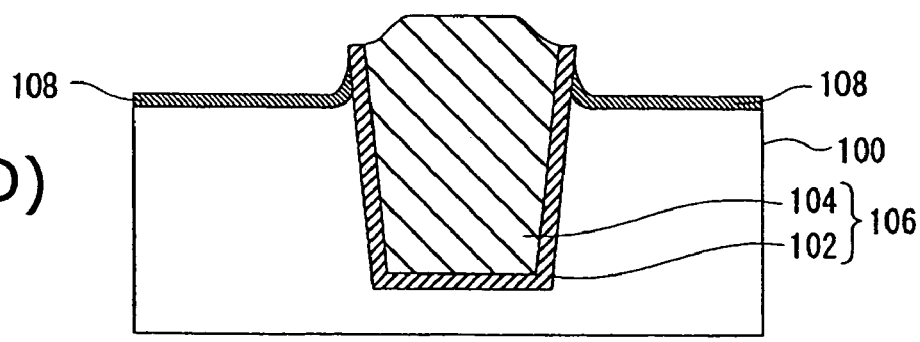

Then, the gate oxide film 108 with a film thickness of 2–10 nm is formed on the surface 100c of the Si substrate 100 by, for example, the thermal oxidation method (FIG. 3(D)). At this point, the film thickness of the gate oxide film 108 is larger in the vicinity of the side wall 112 of the STI oxide film 106 because the vicinity of the side wall 112 of the STI oxide film 106 has a relatively high concentration of oxygen because of oxygen in the STI oxide film 106. The gate electrode 110 is formed on the gate oxide film 108 by known technology (not shown).

In the second embodiment, oxygen ion is implanted after performing the anisotropic-etching but before forming the sacrifice oxide film 114b. When oxygen ion is implanted into the surfaces of the Si substrate 100 and the element-isolating region, positive charge of the oxygen ion is diffused immediately in the surface of the Si substrate, while positive charge of the oxygen ion stays in the element-isolating region. Accordingly, the implantation amount of oxygen ion is small in the Si substrate in the vicinity of the element-isolating region because of the shield effect by positive charge in the element-isolating region. When the sacrifice oxide film 114b is formed on thus formed Si substrate 100, the film thickness of the sacrifice oxide film 114b is made small in the vicinity of the element-isolating region and made large in the area far from the element-isolating region because of a large implantation amount of oxygen ion.

When the gate oxide film 108 is formed after removing the sacrifice oxide film 114b, the gate oxide film 108 is raised toward the side wall more sharply than that of the first embodiment. In the same way as the first embodiment, the film thickness of the gate oxide film is formed larger toward the side wall of the element-isolating region.

When the gate electrode is formed on such a gate oxide film and the element-isolating region, the gate breakdown voltage increases and the leakage current is difficult to occur.

In the semiconductor device according to the present invention, since the surface of the element-isolating region of the wafer is higher than the surface of the Si substrate, the pointed portion and thin film thickness in the edge region are difficult to produce. Also, since the film thickness of the gate oxide film is formed large in the vicinity of the side wall of the element-isolating region, the leakage current is hard to be produced and the gate breakdown voltage increases.

In the method of manufacturing the semiconductor device according to the present invention, since the Si substrate is etched after the element-isolating region is formed, the surface of the element-isolating region is firmly formed higher than the surface of the Si substrate. Accordingly, the malfunction about the height of the surface of the wafer caused by CMP is prevented. Also, the production of the pointed portion and thin film thickness of the gate oxide film in the edge region are prevented. In addition, since the gate oxide film is formed thick in the vicinity of the side wall of he element-isolating region, the leakage current is difficult to draw and the gate breakdown voltage increases, which assures the device characteristics and increases the production yield.

The invention claimed is:

1. A method of manufacturing a semiconductor device comprising the steps of:
   scraping an upper surface of a silicon substrate by an anisotropic-etching such that an upper surface of an element-isolating region filled with an oxide film is positioned higher than said upper surface of said silicon substrate;
   forming a sacrifice oxide film on said upper surface of said silicon substrate by oxidizing said upper surface of said silicon substrate;
   removing said sacrifice oxide film; and
   forming a gate oxide film on said upper surface of said silicon substrate.

2. The method according to claim 1, which further comprises the step of implanting oxygen ion into said upper surface of said silicon substrate.

3. The method according to claim 1, wherein, in the step of scraping the upper surface of the silicon substrate, said silicon substrate is scraped such that the upper surface of the silicon substrate is gradually rising toward the element-isolating region.

4. The method according to claim 1, wherein, in the step of forming the gate oxide film, said gate oxide film is formed such that a thickness thereof is gradually increasing toward the toward the element-isolating region.

5. The method according to claim 1, wherein, in the step of forming the gate oxide film, said gate oxide film is formed such that an upper surface thereof is gradually rising toward the element-isolating region.

6. A method of manufacturing a semiconductor device comprising the steps of:
   forming a pad oxide film on a silicone substrate through thermal oxidation;
   forming a mask film on the pad oxide film;
   forming an opening in the mask film as an element-isolating region;
   forming a trench in the opening;
   forming a side-wall oxide film on a bottom surface and side surfaces of the trench through thermal oxidation;
   filling the trench with an oxide film;
   removing the mask film and the pad oxide film so that the oxide film is exposed;
   scraping the silicon substrate so that the oxide film and the side-wall oxide film protrude above an upper surface of the silicon substrate;
   forming a sacrifice oxide film on the silicon substrate;
   removing the sacrifice oxide film; and
   forming a gate oxide film on the silicon substrate.

7. The method according to claim 6, further comprising the step of implanting oxygen ions into the silicon substrate.

8. The method according to claim 6, wherein, in the step of scraping the silicon substrate, said silicon substrate is scraped such that the upper surface of the silicon substrate is gradually rising toward the side-wall oxide film.

9. The method according to claim 6, wherein, in the step of forming the gate oxide film, said gate oxide film is formed such that a thickness thereof is gradually increasing toward the side-wall oxide film.

10. The method according to claim 6, wherein, in the step of forming the gate oxide film, said gate oxide film is formed such that an upper surface thereof is gradually rising toward the side-wall oxide film.

* * * * *